United States Patent [19]

Mikami et al.

[11] Patent Number: 5,116,640

[45] Date of Patent: May 26, 1992

[54] PROCESS FOR PREPARING AN ELECTROLUMINESCENT DEVICE

[75] Inventors: Akiyoshi Mikami, Yamatotakada; Takashi Ogura, Nara; Kousuke Terada, Tenri; Masaru Yoshida, Nara; Takuo Yamashita, Tenri; Koichi Tanaka, Nara; Katsushi Okibayashi, Sakurai; Shigeo Nakajima, Nara; Hiroaki Nakaya, Tenri; Kouji Taniguchi, Nara, all of Japan

[73] Assignee: Sharp Kabushiki Kaisha, Osaka, Japan

[21] Appl. No.: 594,139

[22] Filed: Oct. 10, 1990

[30] Foreign Application Priority Data

Oct. 24, 1989 [JP] Japan .................................. 1-278133

[51] Int. Cl.⁵ .............................................. B05D 5/12
[52] U.S. Cl. ........................................ 427/66; 427/39; 427/69; 427/70; 427/109; 427/126.2; 427/255.2; 427/255.3; 427/255.5; 427/255.7; 427/419.1; 118/719; 118/723; 118/729
[58] Field of Search .................. 427/64, 66, 69, 70, 427/109, 126.2, 255, 255.2, 255.5, 255.7, 419.1, 255.3, 38, 39; 313/498, 506, 509; 428/690, 917; 118/719, 723, 729

[56] References Cited

U.S. PATENT DOCUMENTS 4,721,631  1/1988  Endo et al. ........................ 427/66

FOREIGN PATENT DOCUMENTS 2-152191  6/1990  Japan .
WO88/04467  6/1988  PCT Int'l Appl. .................. 313/509

Primary Examiner—Shrive Beck
Assistant Examiner—Terry J. Owens

[57] ABSTRACT

A process for preparing an electroluminescent device includes the steps of forming an insulating layer and a luminescent layer on a substrate, wherein the insulating and luminescent layers are respectively formed at different forming areas in the same deposition chamber.

6 Claims, 4 Drawing Sheets

PROCESS FOR PREPARING AN ELECTROLUMINESCENT DEVICE

FIELD OF THE INVENTION

The present invention relates to a process for preparing an electroluminescent device.

BACKGROUND OF THE INVENTION

An electroluminescent device is generally prepared by forming a transparent electrode, a lower insulating layer, a luminescent layer, an upper insulating layer and a back electrode on a transparent substrate, made of glass and the like, in this order. In this process, the transparent electrode, the lower and upper insulating layers are formed by sputtering, and the luminescent layer and the back electrode are formed by electron beam vapor deposition.

As mentioned above, since two processes are employed for preparing one device, the change of apparatus and other treatments therewith are required, thus increasing the production cost of the device. In addition, when the luminescent layer is formed by an electron beam vapor deposition method, a layer having very poor crystallinity, a so called "dead layer", is initially formed. Accordingly, in order to obtain high luminance, the luminescent layer must be increased in thickness so as to increase a driving voltage.

SUMMARY OF THE INVENTION

In order to overcome the above mentioned defects, the present invention provides an improved process for preparing an electroluminescent device. The process of the present invention comprises forming an insulating layer and a luminescent layer on a substrate, wherein the insulating and luminescent layers are respectively formed at different forming areas on the same vapor deposition apparatus. The present invention is based on a vapor deposition technique for producing an electroluminescent device of Japanese Kokai Publication 289091/1989 and Japanese Patent Application Ser. No. 304820/1988, which are proposed by the present inventors.

DETAILED DESCRIPTION OF THE INVENTION

In order to form a luminescent layer by a vapor deposition method, a substrate of glass and the like is placed in a hydrogen or inert gas atmosphere and kept at a certain temperature range. Then, (a) a II group element and a VI group element or a compound thereof for constituting a II-VI group semiconductor, and (b) a halide of an element which acts as a luminescent center in the II-VI group semiconductor are contacted with the substrate as vapor to form a luminescent layer.

According to the present process, the insulating layer and the luminescent layer are continuously produced in the same vapor deposition apparatus without taking the substrate out from the apparatus. The process eliminates the change of the apparatus and other treatments therewith, to thereto reduce the producing cost. In addition, since the luminescent layer is prepared by the vapor deposition process, the "dead layer" can be made thinner than in the electron beam vapor deposition method. Accordingly, the driving electric power significantly decreases.

BRIEF EXPLANATION OF THE INVENTION

Figure 1:
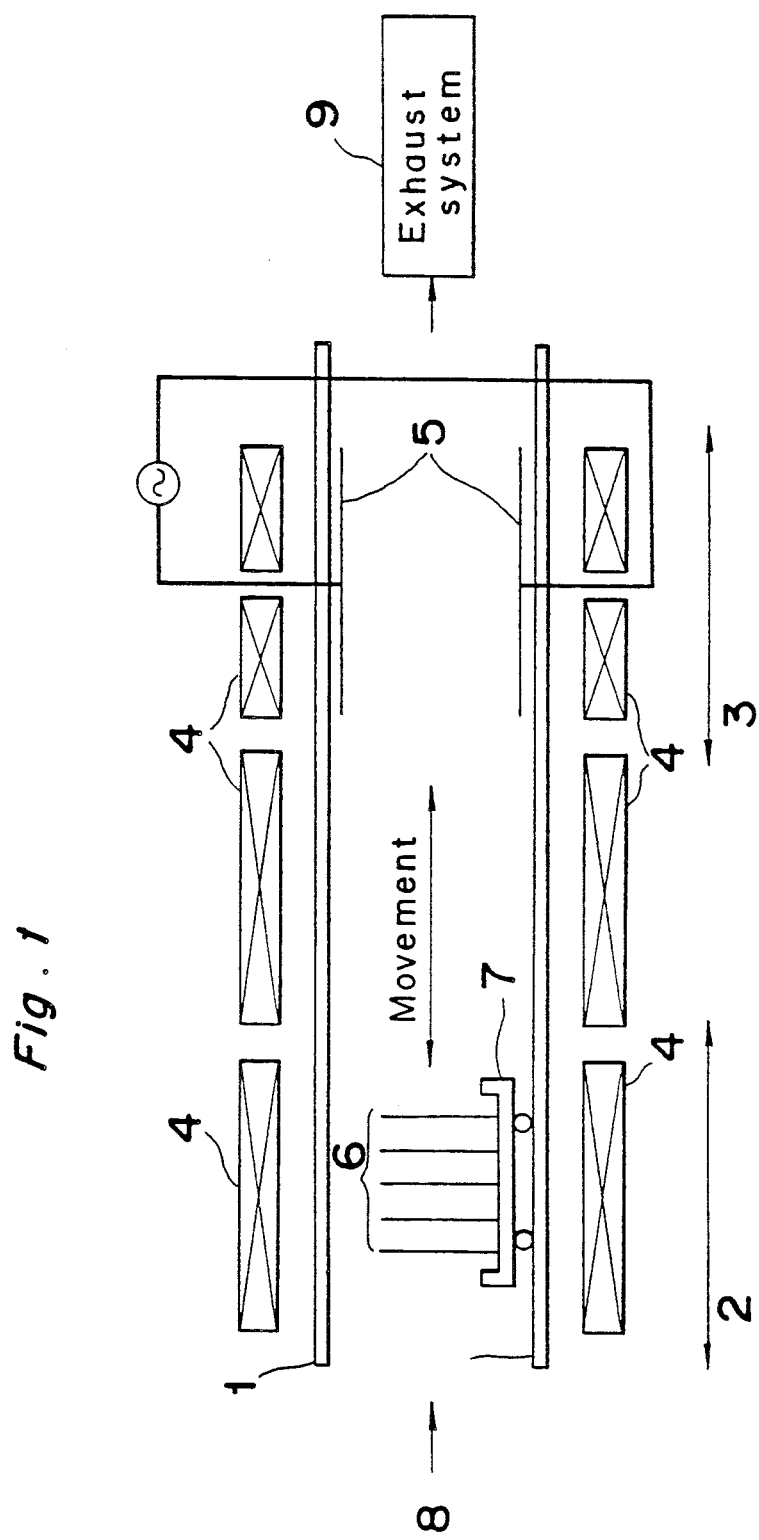

FIG. 1 schematically shows an embodiment of the vapor deposition apparatus of the present invention.

Figure 2:
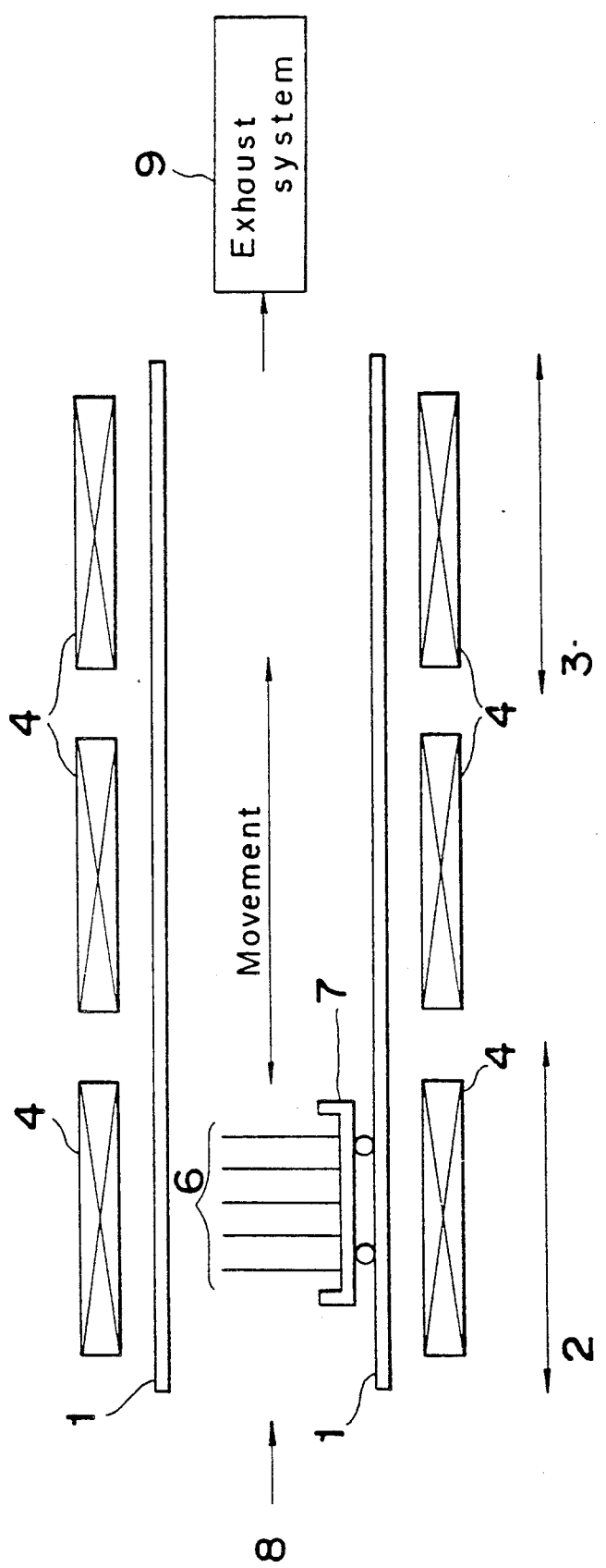

FIG. 2 schematically shows another embodiment of the vapor deposition apparatus of the present invention.

Figure 3:
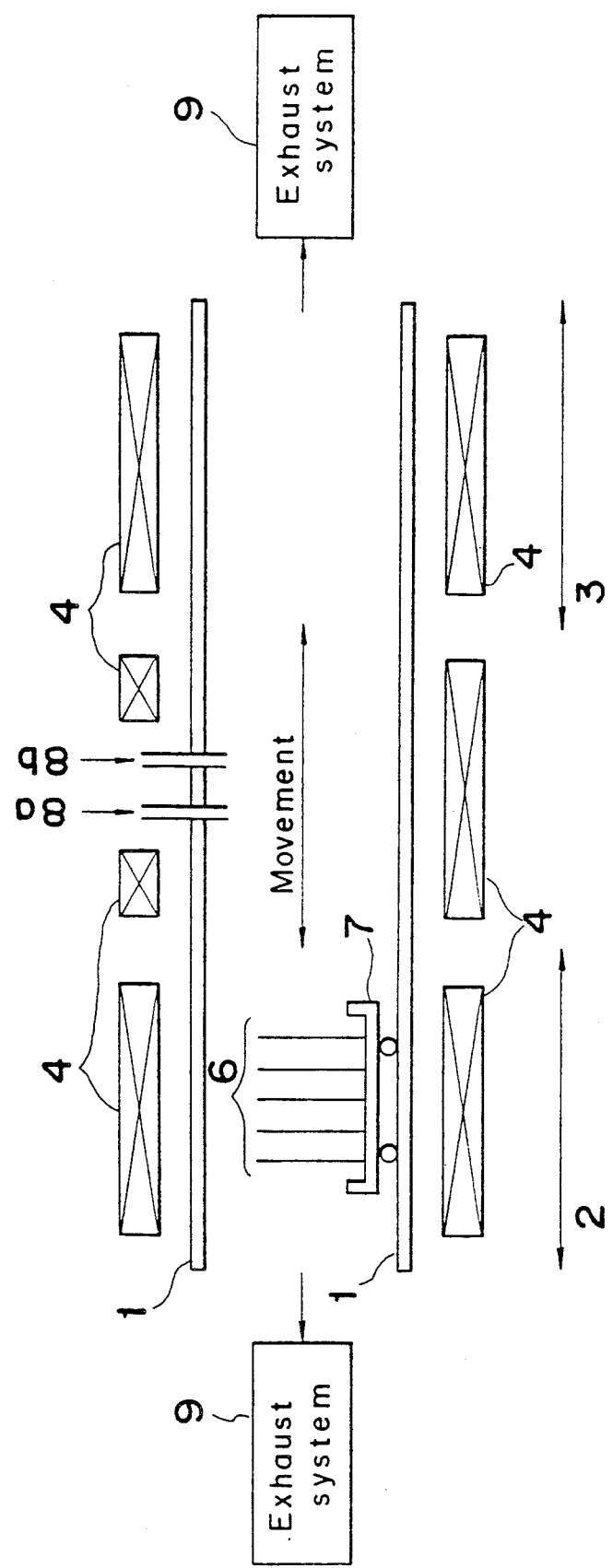

FIG. 3 schematically shows another embodiment of the vapor deposition apparatus of the present invention.

Figure 4:
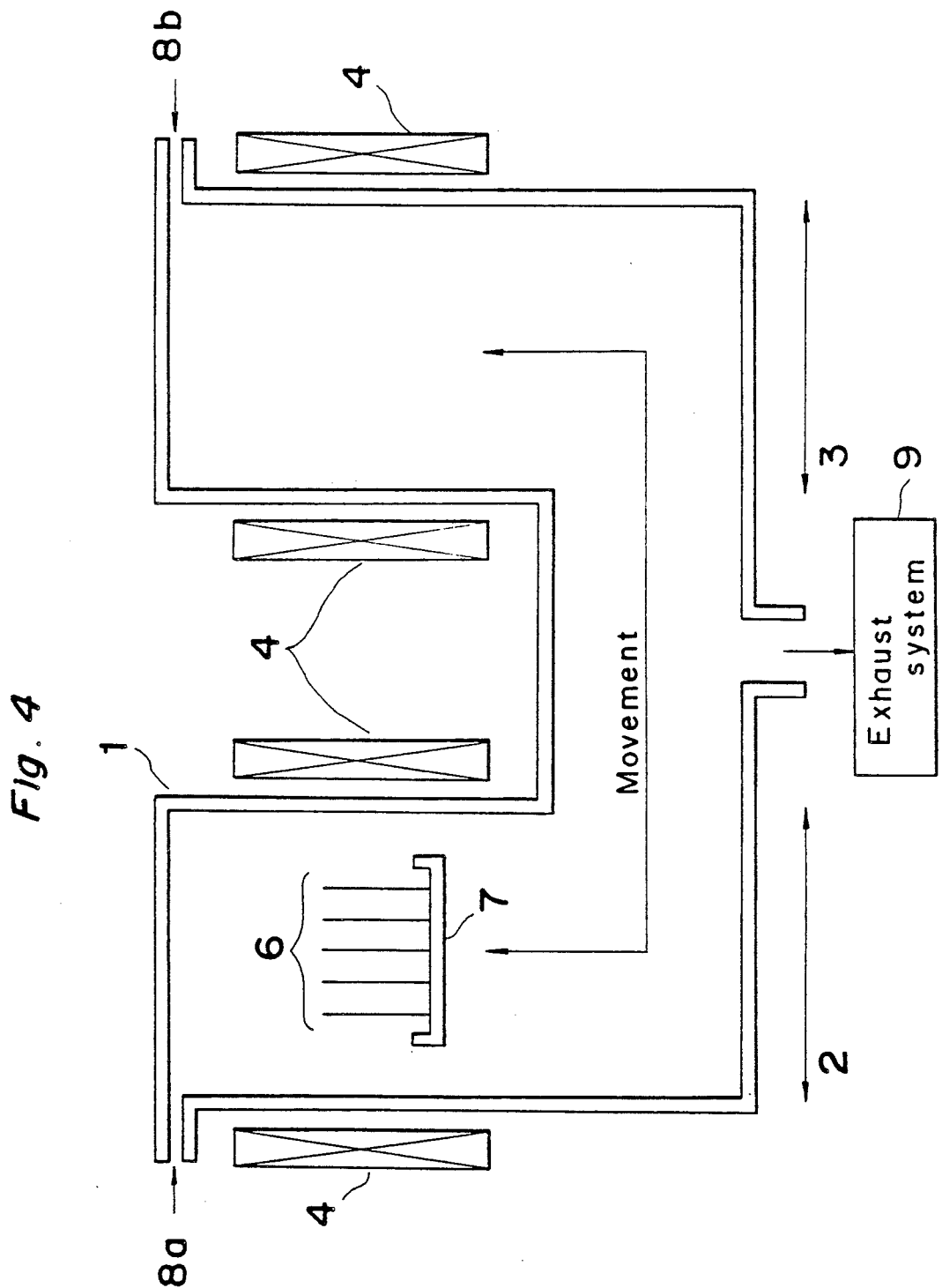

FIG. 4 schematically shows another embodiment of the vapor deposition apparatus of the present invention.

PREFERRED EMBODIMENT OF THE INVENTION

As is shown in FIG. 1, a quartz reaction tube 1 has a luminescent layer forming area 2 by a heat chemical vapor deposition (CVD) method and an insulating layer forming area 3 by a plasma CVD method, and is surrounded with heaters 4. Glass substrates 6, having thereon a stripe type transparent electrode layer, are put on a substrate holder 7 which is placed in the insulating layer forming area 3 in the reaction tube 1. The reaction tube 1 is kept at a pressure of 0.1 to 10 torr by an exhaust system, into which $SiH_4$ gas (0.1 to 5 sccm) and $N_2$ gas (20 to 200 sccm) is introduced from a gas inlet 8. In this condition, a radiofrequency electric power of 100 to 400 W is applied to a radiofrequency electrode 5 to generate discharge, thus producing an $Si_3N_4$ film on the substrates 6 which are heated to 100° to 400° C. Of course, if $N_2O$ gas is mixed with $N_2$ gas, an SiON or $SiO_2$ film can be formed. If gas is changed with another gas, a laminated film can also be formed.

Subsequently, the substrates 6 are moved to the luminescent layer forming area 2, and heated between 350° to 650° C. At this temperature range, $H_2$ gas flows at a flow rate of 50 to 500 sccm and solid ZnS is transferred therewith, and HCl gas flows at a flow rate of 0.5 to 50 sccm. Further, solid Mn is transferred therewith to form a ZnS:Mn luminescent film on the substrates 6.

Next, the substrates 6 are again moved to the insulating layer forming area 3 and the upper insulating layer is formed as generally described above. Then, the back electrode of aluminum is formed as crossing with the transparent electrode, thus obtaining an electroluminescent device.

In the above mentioned process, the insulating layer is formed by the plasma CVD method, but it can be formed in the insulating layer forming area 3 by a heat CVD method using the apparatus of FIG. 2. In this case, $SiH_4$ gas and $O_2$ gas are employed to form an $SiO_2$ film, and $SiH_4$ gas and $NH_3$ gas are employed to form an $Si_3N_4$ film.

Although both the luminescent layer and insulating layer can be formed at the same position in the reaction tube, this is not preferred because the deposited material attached to the inside of the reaction tube wall is mixed into the other layer as impurities. Accordingly, in the present invention, the two forming areas are arranged, thus forming the film in high purity and uniforming the physical properties of the deposited film.

In order to reduce the inclusion of impurities, it is preferred that the apparatus may be modified by arranging a gas inlet 8a for forming the luminescent layer and a gas inlet 8b for forming the insulating layer at the center of the reaction tube 1, as shown in FIG. 3. In this apparatus, the carrier gas for forming the luminescent layer is introduced from the gas inlet 8a and exhausted from the side of the luminescent film forming area 2; and the carrier gas for forming the insulating layer is introduced from the gas inlet 8b and exhausted from the side of the insulating layer forming area 3. As shown in FIG. 4, a U-shape reaction tube 1 may also be employed, with the luminescent layer forming area is located in the left side of the tube and the insulating layer forming area is located in the right side of the tube. The carrier gas is exhausted from the middle area of the tube.

The present invention is explained by the above embodiments. However, it should be noted that the obtained film, mentioned above, is not limited to ZnS:Mn, $Si_3N_4$ and $SiO_2$ film. The insulating layer is not always formed in the same apparatus as the luminescent layer. The present invention is not to be construed as limited to the above embodiment.

According to the process of the present invention, the electroluminescent device can be easily prepared at a low producing cost. In addition, the luminescent layer has a very thin dead layer and can reduce a driving electric power.

What is claimed is:

1. A process for preparing a display comprising the steps of:

forming an insulating layer on a substrate in a first forming area of a vapor deposition chamber; and forming a luminescent layer on the substrate in a second forming area, different from the first forming area in the vapor deposition chamber.

2. The process of claim 1, further comprising the step of:

moving said substrate to said second forming area for subsequent formation of said luminescent layer, after forming said insulating layer in the first forming area.

3. The process of claim 1, further comprising the step of:

moving said substrate to said first forming area for subsequent formation of said insulating layer, after forming said luminescent layer in the second forming area.

4. The process of claim 1, wherein the luminescent layer is formed by chemical vapor deposition (CVD).

5. The process of claim 1, wherein the insulating layer is formed by plasma chemical vapor deposition.

6. The process of claim 1, wherein the insulating layer is formed by heat chemical vapor deposition.

* * * * *